United States Patent [19]

Veal et al.

[11] Patent Number: 5,173,476
[45] Date of Patent: Dec. 22, 1992

[54] 110 K BI-SR-CA-CU-O SUPERCONDUCTOR OXIDE AND METHOD FOR MAKING SAME

[75] Inventors: Boyd W. Veal, Downers Grove; John W. Downey, Joliet; Daniel J. Lam, Orland Park; Arvydas P. Paulikas, Downers Grove, all of Ill.

[73] Assignee: The United States of America as represented by the United States Department of Energy, Washington, D.C.

[21] Appl. No.: 252,698

[22] Filed: Oct. 3, 1988

[51] Int. Cl.$^5$ .................... C01B 13/18; C01F 11/04; C01G 3/02; C01G 29/00
[52] U.S. Cl. .................................... 505/1; 252/518; 252/521; 423/604; 423/617; 423/635; 505/742; 505/782
[58] Field of Search .................. 505/1, 742, 782, 801, 505/800, 809, 810, 815; 252/518, 521; 423/604, 617, 635

[56] References Cited
PUBLICATIONS

Maeda, H. et al., *Jpn. J. Appl. Phys.*, 27, L209-L210 Feb. 26, 1988.
Matsui, Y. et al., *Jpn. J. Appl. Phys.*, 27, L361-L364, Mar., 1988.
Mizuno, M. et al., *Jpn. J. Appl. Phys.*, 27, L1225-L1227, Jul., 1988.
Takano, M. et al., *Jpn. J. Appl. Phys.*, 27, L1041-L1043, Jun., 1988.
Zandbergen, H. W. et al., *Nature*, 332, pp. 620-623, Apr. 14, 1988.

*Primary Examiner*—Paul Lieberman
*Assistant Examiner*—John Boyd
*Attorney, Agent, or Firm*—Thomas G. Anderson; James W. Weinberger; William R. Moser

[57] ABSTRACT

A superconductor consisting of a sufficiently pure phase of the oxides of Bi, Sr, Ca, and Cu to exhibit a resistive zero near 110 K resulting from the process of forming a mixture of $Bi_2O_3$, $SrCO_3$, $CaCO_3$ and $CuO$ into aparticulate compact wherein the atom ratios are $Bi_2$, $Sr_{1.2-2.2}$, $Ca_{1.8-2.4}$, $Cu_3$. Thereafter, heating the particulate compact rapidly in the presence of oxygen to an elevated temperature near the melting point of the oxides to form a sintered compact, and then maintaining the sintered compact at the elevated temperature for a prolonged period of time. The sintered compact is cooled and reground. Thereafter, the reground particulate material is compacted and heated in the presence of oxygen to an elevated temperature near the melting point of the oxide and maintained at the elevated temperature for a time sufficient to provide a sufficiently pure phase to exhibit a resistive zero near 110 K.

4 Claims, 7 Drawing Sheets

110 K BI-SR-CA-CU-O SUPERCONDUCTOR OXIDE AND METHOD FOR MAKING SAME

CONTRACTUAL ORIGIN OF THE INVENTION

This invention was made with Government support under Contract Number W-31-109-ENG-38 awarded by the United States Department of Energy. The Government has certain rights in the invention.

BACKGROUND OF THE INVENTION

Beginning with the discovery of superconductivity in the yttrium, barium, copper oxide, an enormous number of materials have been tested for superconductivity. Although the yttrium, barium, copper oxide material when it was first prepared became superconducting at elevated temperatures, upon examination of the material it was found that the actual superconducting phase was but a very minor amount of the material prepared in bulk. Apparently, the yttrium, barium, copper oxide system is superconducting because the superconducting phase is distributed throughout the lattice structure of the material and is capable of formulating current paths. This is not the case with the Bi, Sr, Ca, Cu oxide system. In the Bi, Sr, Ca, Cu oxide system, it has been found that the material when formulated is intercalated or interleaved. That is material having very low $T_c$ phase is interleaved with a 110 K $T_c$ phase. Because of the interleaving or intercalated nature of the Bi, Sr, Ca, Cu oxide system, it has been impossible to isolate the superconducting phase and more particularly it has been impossible to isolate the 110 K transition temperature material. Heretofore, the Bi, Sr, Ca, Cu oxide material has only shown zero resistance below 100K, typically at 85K due to the inability to segregate the 110K phase.

Accordingly, it is a principal object of this invention to provide a material which has sufficient phase purity to exhibit zero electrical resistance at 110K.

It is also an object of the invention to provide a method of producing bulk quantities of single phase superconducting material.

Another object of this invention is to provide a superconductor consisting of a sufficiently pure phase of the oxides of Bi, Sr, Ca and Cu to exhibit a resistive zero near 110K.

Still another object of the invention is to provide a superconductor consisting of a sufficiently pure phase of the oxides of Bi, Sr, Ca and Cu to exhibit a resistive zero near 110K resulting from the process of forming a mixture of $Bi_2O_3$, $SrCO_3$, $CaCO_3$ and CuO into a particulate compact wherein the atom ratios are $Bi_2$, $Sr_{1.4-2.0}$, $Ca_{1.8-2.4}$, $Cu_3$, heating the particulate compact rapidly in the presence of oxygen to a first elevated temperature near the melting point of the oxides to form a sintered compact, maintaining said sintered compact at the first elevated temperature for a prolonged period of time, cooling the sintered compact and regrinding same to form a particulate material, heating the reground particulate material in the presence of oxygen to a second elevated temperature near the melting point of the oxide, and maintaining the reground particulate material at the second elevated temperature for a time sufficient to provide a sufficiently pure phase to exhibit a resistive zero near 110K.

A still further object of the invention is to provide a method of making a single phase superconductor, comprising formulating a mixture of oxide particulates, rapidly heating the oxide particulates in the presence of oxygen to a first elevated temperature near the melting point thereof to sinter same, maintaining the sintered particulates at the elevated temperature for a prolonged period of time, regrinding and compacting the sintered particulates and reheating to a second elevated temperature in the presence of oxygen, maintaining the reground and compacted material at the second elevated temperature for a time sufficient to provide a substantially pure single phase having a resistive zero at a predetermined superconducting temperature.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

DESCRIPTION OF THE PREFERRED EMBODIMENT

Figure 1:
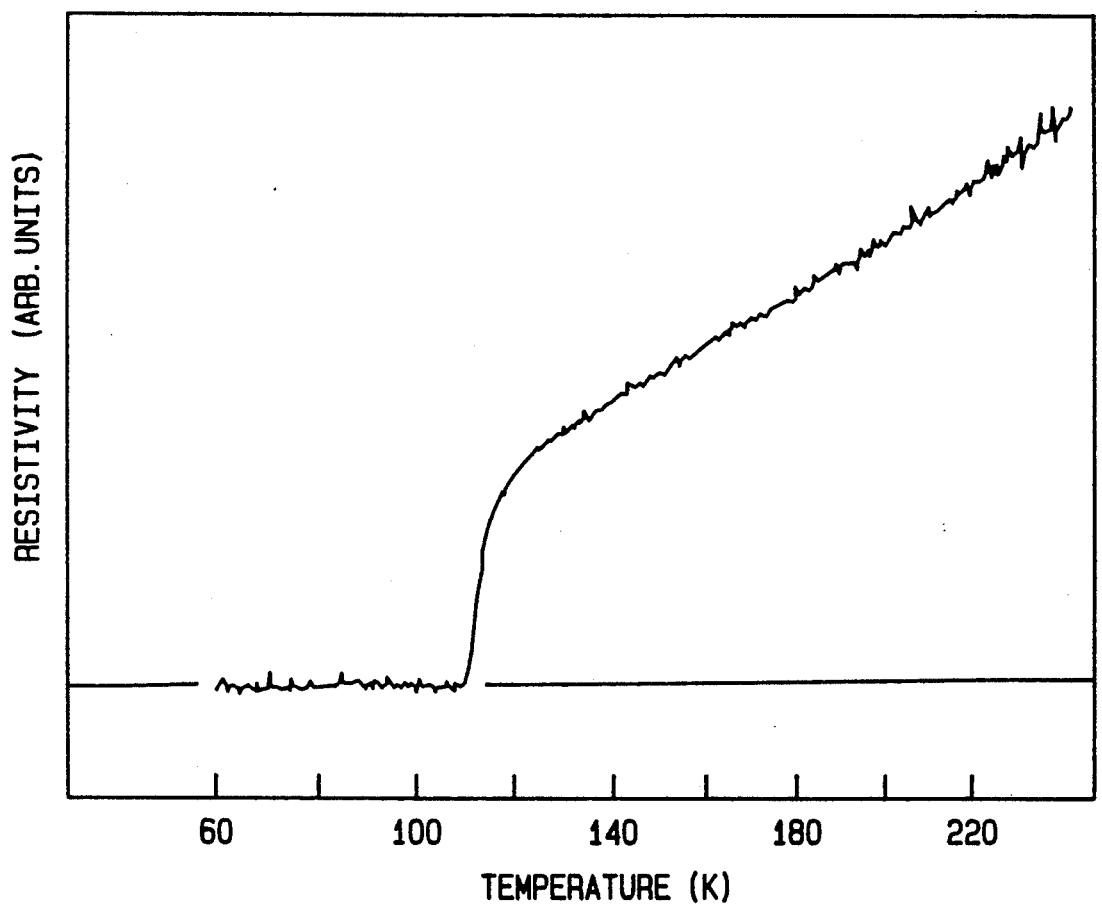
FIG. 1 is a graph illustrating the resistivity vs. temperature for a sample with nominal composition $Bi_2Sr_{1.6}Ca_2Cu_3O_x$.

Since the first reports, in early 1988, of high-Tc superconductivity in the Bi-Sr-Ca-Cu-0 system, many investigators have reported compositions with superconducting transition temperatures in the range of 75–110 K. The exact compositions and lattice parameters corresponding to the different phases are still not well defined. Superconducting compounds with nominal composition $Bi_2Sr_2Ca_1Cu_2Oz$ (2212) and transition temperatures in the range 85–95K have been prepared.

The 110K phase had generally been assumed to have the nominal composition $Bi_2Sr_2Ca_2Cu_3O_x$ (2223) although this high $T_c$ phase has been observed only in multiphase mixtures, and has never previously been isolated. Typically, the high $T_c$ phase appears as a minor constituent. Nevertheless, lattice parameters for the high $T_c$ phase have been reported. For example, lattice parameters are reported by Kijima et al. on material of nominal composition $Bi_1Sr_1Ca_3Cu_4O_x$ (1134). This material is multiphase but shows a nearly complete resistive transition at about 107K.

The discovery which constitutes this invention is the nearly complete isolation of the 110 K phase. Isolation of the phase depends sensitively on the Sr content and on heat treatment procedures. The 110K phase apparently forms as intercalated regions in the low $T_c$ matrix rather than a random phase mix. Consequently, a very large volume fraction of the high $T_c$ phase may exist without resulting in a resistive zero. We have obtained a sufficiently pure phase to observe a resistive zero near 110K.

A series of samples with compositions in the vicinity of the 2223 nominal material have been tested. Best results were obtained for materials with compositions near $Bi_4Sr_3Ca_4Cu_6O_x$ (4346), i.e., somewhat Sr deficient.

The samples were prepared from mixtures of $Bi_2O_3$, $SrCO_3$, $CaCO_3$, and CuO in appropriate ratios. Other salts, such as nitrates may be employed, but carbonates and oxides have been used to illustrate but not limit the invention. The mixture of starting materials was ground in a ball mill or by hand, compacted into a disk, heated rapidly (300° C./h) to 860° C. and held at 860° C. for 20 hours in air. The sintered compacts were reground, mixed thoroughly and recompacted for the final heat treatments. The presintered compacts were then heated to 815° C. at a rate of 300 degrees per hour, and then to 870° C. at 8° C./hour. Samples were then soaked at 870° C. for an additional 120 hours in air before cooling at a rate of 40 degrees per hour to 400° C. The samples were then held at 400° C. for 28 hours and were furnace cooled to room temperature. After treatment, samples are somewhat conical in shape (smaller at the top). Samples from successive heat treatments show somewhat variable superconducting properties. It is believed this is due to variations of heat treatment temperature (resulting from different sample positions in the furnace). One sample (labeled sample f below) was subjected to additional heat treatments consisting of 84 h at 850° C. and 42 h at 840° C. The last (840° C.) treatment gave no significant change (from the 850° C. treatment) in the resistivity. This sample was air quenched.

In general, we have found rapid heating is necessary in the initial calcining step. 300° C./hr is an acceptable heating rate and simply inserting the material into a preheated furnace may be preferred. Heating more slowly forms undesirable phases. The temperature to which the sample is heated should be no lower than 20° C. below the melting point of the sample. If the calcination takes place at a lower temperature, vastly inferior results occur. Preferably, a temperature within 10° C of the melting point is used.

The calcining should continue for up to about 20 hours, but successful material has been prepared at 12 hours and to about 10 hours should be sufficient. After regrinding and reheating, the samples should be maintained at the elevated temperature for several days, with 3-5 days being sufficient. Cooling to an intermediate temperature of about 400° C. has been employed, but is not believed to be required.

The superconducting properties have been determined from both resistivity and magnetization measurements. Resistivities were measured using a standard four-point probe with an alternating 190 Hz measuring current. The low-field d.c. magnetization measurements were performed using a SQUID magnetometer. Magnetization measurements were taken (1) on samples that had been cooled in zero field (shielding) and (2) on samples cooled in 2 Gauss field (Meissner effect). A 2 Gauss measuring field was used in both cases; in each case data were acquired on warming. Flux trapping (or remanence) was measured in zero field on warming after initially cooling the sample to 4K in a field of 2 Gauss.

X-ray powder diffraction measurements on sintered compacts were made using a GE diffractometer. Measurements were made at room temperature using $CuK_\alpha$ radiation. Since the sintered compacts were X-rayed without further powdering, sample texturing could influence relative intensities of the diffraction lines.

Figure 2:
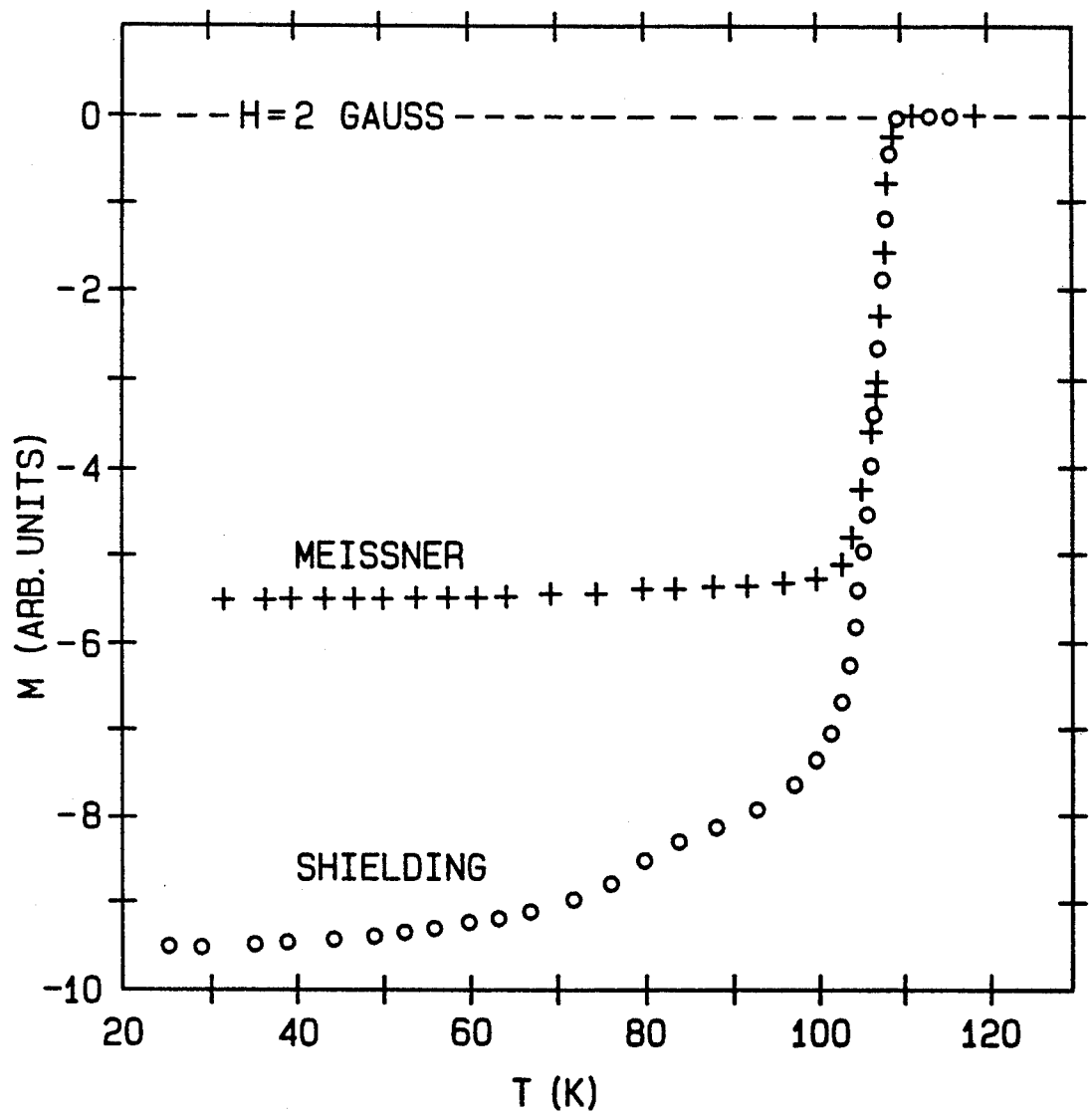
FIG. 2 is a graph illustrating Meissner (upper curve) and shielding (lower curve) effects for the sample of FIG. 1.
Figure 3:
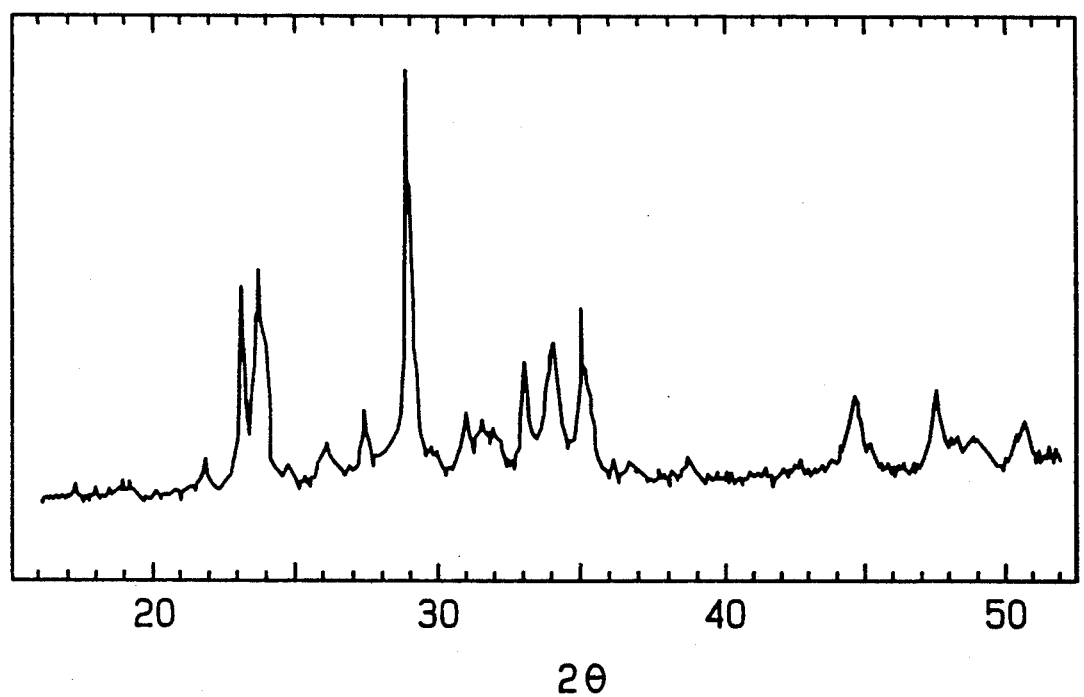
FIG. 3 is a X-ray diffractometer spectrum from a sample of FIGS. 1–2.

Superconducting samples of the general formula $Bi_2Sr_xCa_yCu_3O_z$ where Sr content x is varied between 1.2 and 2.2 for three composition series with Ca contents specified by y=2, 2.2 and 2.4 were prepared. Best results were obtained for a sample of composition x=1.6 and y=2.0. FIG. 1 shows the resistivity, FIG. 2 shows the magnetization (both Meissner effect and shielding measurements), and FIG. 3 shows the X-ray powder diffraction pattern for this sample. The sample displays a resistive zero at T=110±1K, in agreement with the onset of diamagnetism at 109K shown in FIG. 2. The Meissner effect shows a very sharp transition, being essentially complete by 100K. However, the shielding signal increases in magnitude to about 60K indicating some degree of inhomogeneity. At low temperatures the Meissner signal amounts to about 60% of the shielding signal increasing to 100% a few degrees below the superconductive transition temperature. The shielding signal, corrected for demagnetization effects, should in principle yield the volume fraction of the superconductive phase. However, due to the irregular shape and variation in packing density of the samples, only approximate values can be calculated for the superconductive volume fraction. For all samples tested, the superconductive volume fraction at 4K lies between 50 and 100%, i.e., in all cases the samples are bulk superconductors. When cooled to 77K, the sample of FIGS. 1 and 2 (about 1 gm) levitates approximately ⅜ inch above a small Nd-Fe-B magnet which confirms bulk superconductivity for this sample. Though not apparent in the Meissner data, the shielding data of FIG. 2 indicate that a small admix of the low $T_c$ phase ($T_c$ near 75K) remains in the sample. This phase can also be detected in the X-ray diffraction pattern of FIG. 3. As we discuss subsequently, the two peaks with $2\theta = 27.6$ and 31.1, appear to provide the best indicator of contamination by the low $T_c$ phase.

Figure 4:
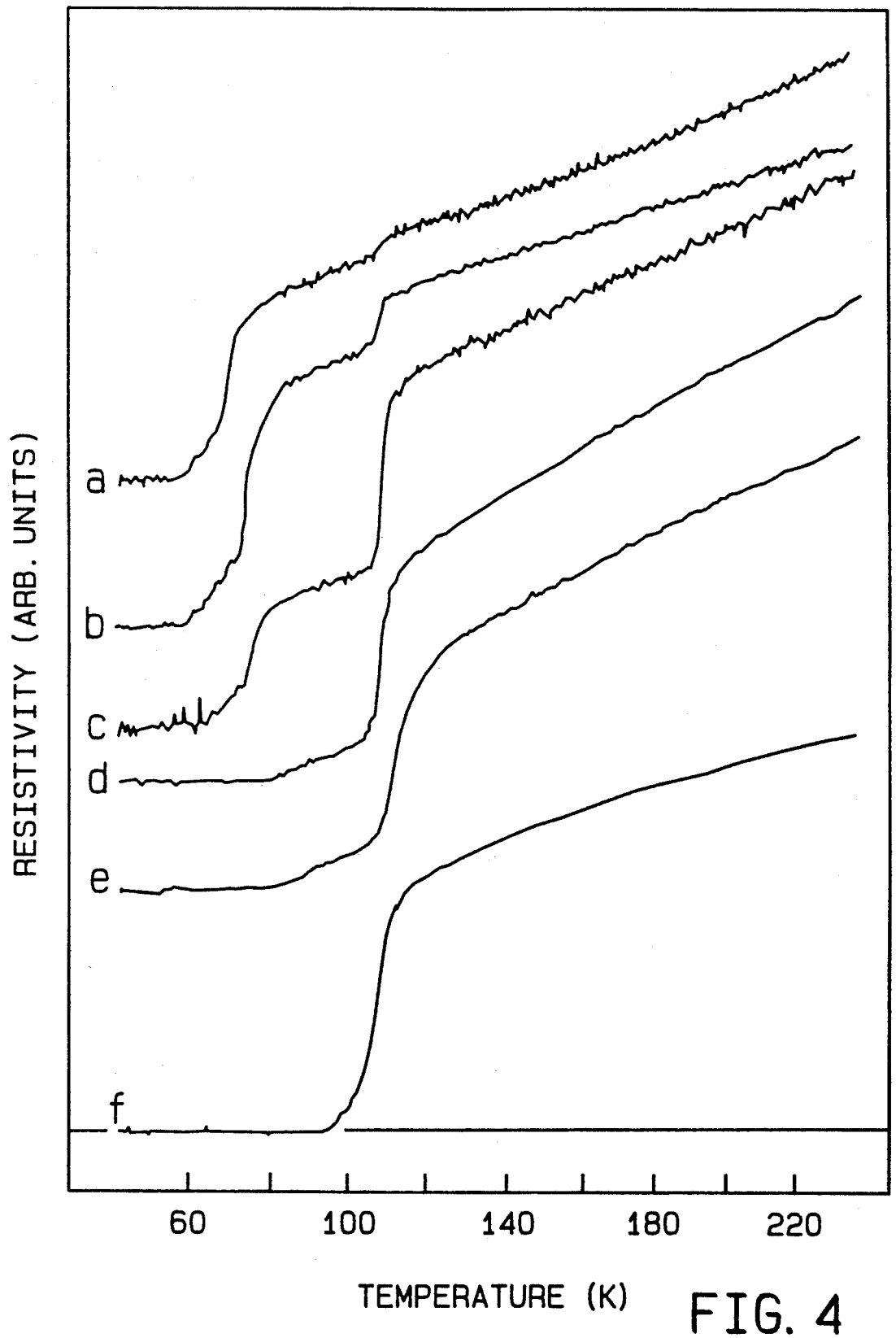
FIG. 4. is a graph illustrating resistivity vs. temperature for a series of samples with composition $Bi_2Sr_xCa_2Cu_3Oz$ where (a) x =2.2, (b) x =2.0, (c) x =1.8, (d) x=1.6, and (e) x=1.4. For example (f) x=1.6, but it had an additional heat treatment.

FIG. 4 shows resistivity data for a series of samples prepared independently from the sample of FIGS. 1 to 3. The Ca concentration is fixed at y=2 with the Sr concentration being systematically decreased from x =2.2 (curve a) to x=1.4 (curve e). Curve f in FIG. 4 is for the same concentration as that of curve d (x =1.6) but after an additional heat treatment as explained above. Two distinct superconductive phases are clearly present—one with a $T_c$ near 110K, the other near 75K. As the Sr-concentration decreases the 110K phase becomes more and more dominant. Apparently, the fraction of high $T_c$ phase is very sensitive to the Sr content. At the 2223 composition (curve b), only a small drop in resistivity occurs near 110 K. These samples were processed together but subsequent to the sample of FIGS. 1-3. Because processing steps were somewhat different (the later samples were calcined at 820° C. after heating at a rate of 70° C./h) for the two heat treatments, final results for samples with the same nominal compositions are somewhat different. In particular, a larger residual of the low $T_c$. phase persists for the later heat treatment. For sample f, the additional heat treatment (discussed above) sharpened the transition although it was shifted slightly to lower Tc.

Figure 5:
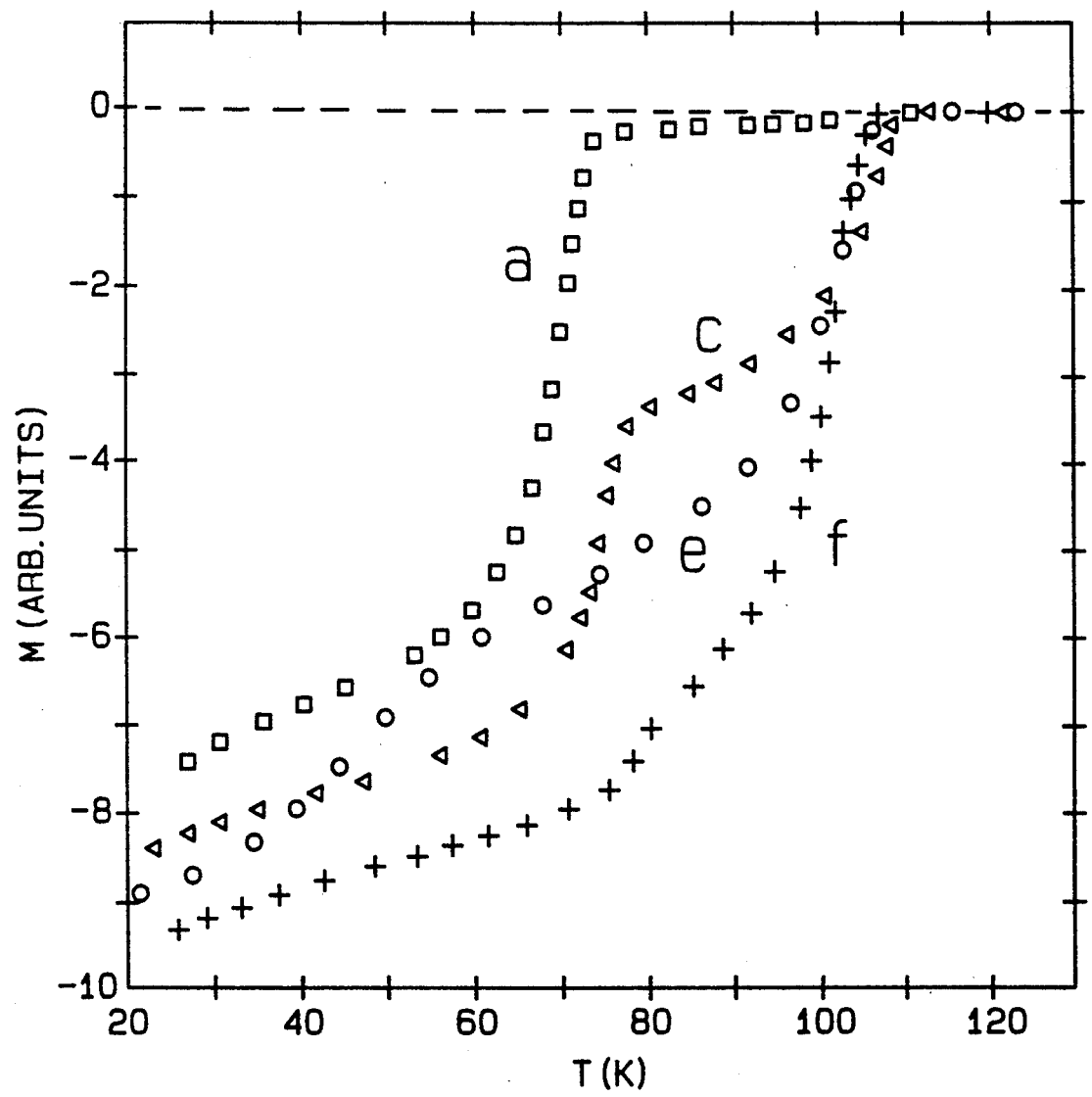
FIG. 5 is a graph illustrating shielding effects vs. temperature for four of the samples of FIG. 4; (a) x =2.2, (c) x=1.8, and (e) x=1.4. For sample (f) x=1.6 but it had an additional heat treatment.

FIG. 5 displays the shielding curves for four of the samples of FIG. 4. The diamagnetic signal of all four curves has been normalized to $-10$ at 4K. The shapes of the curves are quite similar to the corresponding resistive transitions in FIG. 4. The ratio of the two phases as determined from the two steps in the magnetic transitions (FIG. 5) is remarkably close to the step ratio seen in the resistance. For example, the magnetic data for sample c indicate the presence of about 30% of the 110K phase. This large amount of the high $T_c$ phase should be more than enough to obtain a superconductive path. However, the resistance at 80K for this sample is still about 40% of its normal state value just above 110 K. This clearly indicates that the two phases are not randomly distributed but are highly correlated. The 110K phase is formed by intercalation of additional Ca-CuO$_2$ layers into the low $T_c$ structure. The resulting 110K layers are thus well separated by the low $T_c$ phase inhibiting an electrical short.

The preparation used for samples (a) through (e) did not yield as high a volume fraction of the 110K phase as the preparation used for the sample of FIGS. 1-3. This may be due to the difference in the calcine step. However, additional heat treatment can significantly increase the 110K volume fraction. For example, curve (f) in FIGS. 4 and 5 shows data for sample (d) after the additional treatment mentioned above.

Figure 6:
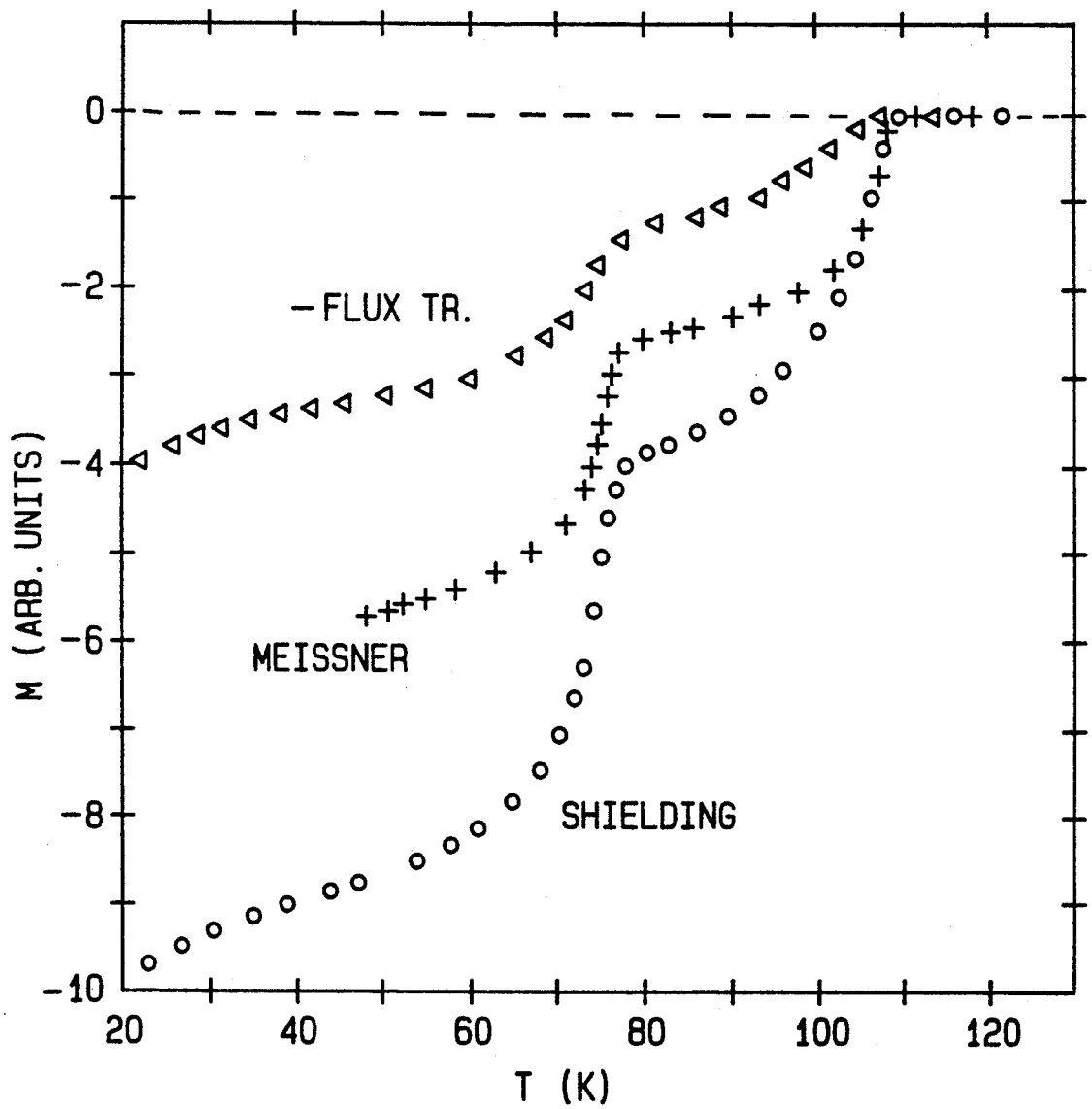
FIG. 6 is a graph illustrating shielding, Meissner and flux trapping data for the sample labeled c in FIGS. 4 and 5.

Additional magnetic measurements on a two phase sample (sample c of FIGS. 4 and 5) are shown in FIG. 6. In addition to shielding data, FIG. 6 also shows Meissner and flux trapping data. (For comparison the flux trapping signal is inverted.) All three curves are quite similar in nature showing the same relative amounts of the two phases. As has been recognized in other high $T_c$ single phase materials, the sum of the magnitude of Meissner and flux trapping signals equals the shielding signal to within 5% over the whole temperature range. Thus, all measurements presented here on two phase samples display features reflecting the special morphology of the two phase mixture.

For the two Ca enriched y=2.2 and 2.4 series in the Bi$_2$Sr$_x$Ca$_y$Cu$_3$O$_z$ materials with $1.4 \leq x \leq 2.2$, results very similar to those of FIGS. 4 and 5 were produced. The strongly mixed-phase behavior of curve (c) (FIGS. 4 and 5) is observed when Sr is dilute or deficient. The resistivity results for y=2.2 appear to be somewhat superior to those for y=2.0 and 2.4, with resistivity zeroes observed near 110K for the two Sr dilute (deficient) samples but no clearly discernable difference appears in magnetization measurements for samples with the same x (Sr content).

Figure 7:
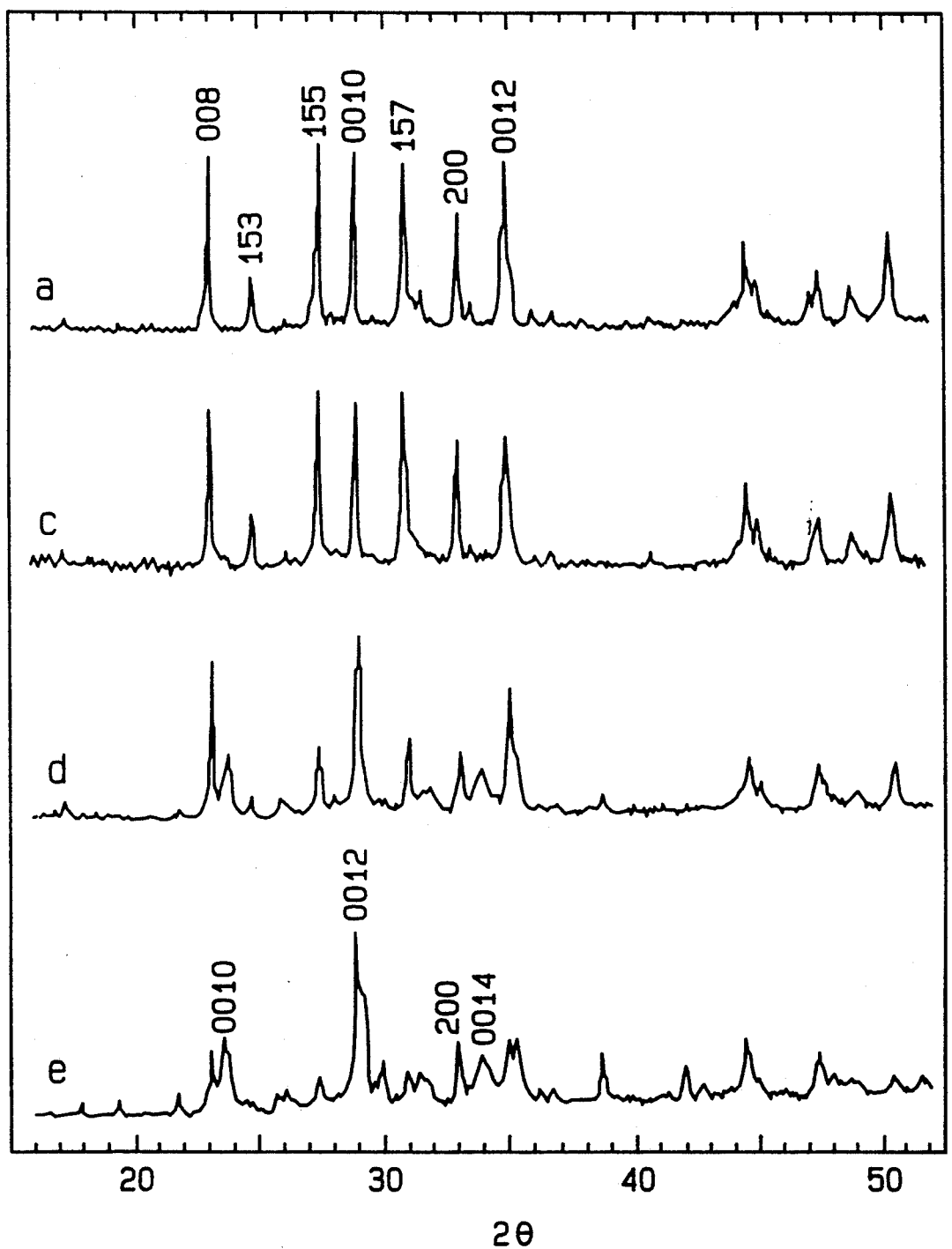
FIG. 7 shows x-ray diffractometer spectra for samples of FIG. 4: (a) x=2.2, (c) x=1.8, (d) x=1.6, and (e) x=1.4.

FIG. 7 shows X-ray diffractometer traces for the sample series of FIGS. 4-5 where y=2.0 and $1.4 \leq x \leq 2.2$. These data show the evolution, with composition, from the low $T_c$ phase to the high $T_c$ phase. Index lines for the low $T_c$ phase (sample a, x =2.2) are shown in the upper trace; index lines for the high $T_c$ phase (sample e, x=1.4) are indicated on the bottom trace. (001) lines change dramatically in position for the two phases while lines dependent only on $a_o$ and $b_o$ change very little (since $a_o$ and $b_o$ are nearly equal; e.g., the 200 line). Consistent with the results of FIGS. 4-5, lines (0010), (0012), and (0014) denoting the high $T_c$ phase become prominent for $x \leq 1.6$. These lines appear to be broad, perhaps a consequence of the intercalated nature of this phase which might suggest that the crystallographic order of the high $T_c$ phase in the c-direction is imperfect. The systematic variation between the two phases illustrated in FIG. 7 shows that the lines (155) and (157) of the low $T_c$ phase provide sensitive indicators of the presence of the low $T_c$ phase in a mixture of the two phases.

We have found that superconductivity may be obtained at 100K with compositions near 2223, but that phase purity is improved when the composition is Sr deficient and possibly somewhat Ca rich. This suggests that the high temperature phase tolerates a substantial Sr vacancy content and may imply that Ca substitutes on Sr sites. For a given oxygen stoichiometry, Sr site vacancies could cause the fraction of Cu$^{3+}$ ions to be increased.

By examining varied compositions of Bi-Sr-Ca-Cu-O in the vicinity of Bi$_2$Sr$_2$Ca$_2$Cu$_3$O$_x$ (2223), we have succeeded in isolating the 110K superconducting phase. A resistance zero has been observed at 110K coincident with a diamagnetic onset. Because of the intercalated nature of the material, a very high volume fraction of the high $T_c$ phase is needed before interconnection and a resistance zero is observed. Results are very dependent on heat treatment conditions. For processing conditions cited above, the best superconducting properties and highest phase purity were obtained for samples with composition near x=1.5 and y=2, i.e., Bi$_4$Sr$_3$Ca$_4$Cu$_6$O$_x$ (4346).

While there has been disclosed what is considered to be the preferred embodiment of the present invention, it is understood that various changes in the details may be made without departing from the spirit, or sacrificing any of the advantages of the present invention.

We claim:

1. A method of making a superconductor having a resistive zero at 110K, comprising forming a mixture of Bi$_2$O$_3$, SrCO$_3$, CaCO$_3$ and CuO into a particulate compact wherein the atom ratios are 2 for Bi, about 1.6 for Sr, about 2 for Ca, 3 for Cu, heating said particulate compact at a rate not less than about 300° C./hr. in the presence of oxygen to a first elevated temperature near the melting point of the oxides to form a sintered compact, maintaining said sintered compact at said first elevated temperature not less than 20° C. less than the melting point of the compact for not less than about 5 hours, cooling said sintered compact and regrinding same to form a particulate material, heating said reground particulate material in the presence of oxygen to a second elevated temperature near the melting point of the oxide, and maintaining said reground particulate material at the second elevated temperature for not less than about 3 days to provide at least 70 volume percent of a material which exhibits a resistive zero at 110K.

2. The method of claim 1, wherein the sintered particulates are maintained at said first elevated temperature for a time of up to about 20 hrs.

3. The method of claim 1, wherein the reground and compacted material is maintained at said second elevated temperature within about 10° C. of the melting point thereof for a time of not less than 3 to 5 days.

4. The method of claim 3, wherein after the 3 to 5 day period the reground and compacted material is slowly cooled to a temperature less than about half of its melting point and held at said lower temperature for a period of time up to about a day.

* * * * *